(12) United States Patent
Siraj et al.

(10) Patent No.: US 11,304,048 B2
(45) Date of Patent: Apr. 12, 2022

(54) PARTITION A RADIO INTO A SERVICE CHAIN AND A SCAN CHAIN TO SCAN CHANNELS

(71) Applicant: Hewlett Packard Enterprise Development LP, Houston, TX (US)

(72) Inventors: Shahnawaz Siraj, San Jose, CA (US);
Sachin Ganu, San Jose, CA (US);
Andre Beaudin, Montreal (CA); Ben Dunsbergen, San Jose, CA (US);
Manoj Thawani, San Jose, CA (US);
Qiang Zhou, Beijing (CN)

(73) Assignee: Hewlett Packard Enterprise Development LP, Houston, TX (US)

( * ) Notice: Subject to any disclaimer, the term of this patent is extended or adjusted under 35 U.S.C. 154(b) by 25 days.

(21) Appl. No.: 16/616,754

(22) PCT Filed: Jun. 9, 2017

(86) PCT No.: PCT/CN2017/087698
§ 371 (c)(1),
(2) Date: Nov. 25, 2019

(87) PCT Pub. No.: WO2018/223367
PCT Pub. Date: Dec. 13, 2018

(65) Prior Publication Data
US 2020/0162882 A1      May 21, 2020

(51) Int. Cl.
*H03J 1/00* (2006.01)
*H04W 8/00* (2009.01)
(Continued)

(52) U.S. Cl.
CPC .......... *H04W 8/005* (2013.01); *H03J 1/0091* (2013.01); *H03J 7/00* (2013.01); *H03L 7/12* (2013.01);
(Continued)

(58) Field of Classification Search
CPC ........ G01B 9/02004; G01R 31/318536; H04B 10/271; H04J 2003/0058; H03J 7/18;
(Continued)

(56) References Cited

U.S. PATENT DOCUMENTS 5,359,592 A * 10/1994 Corbalis ............... H04L 49/205
370/233
8,089,974 B2    1/2012 Calhoun et al.
(Continued)

FOREIGN PATENT DOCUMENTS

| CN | 1815915 A | 8/2006 |
| CN | 101543122 A | 9/2009 |
| CN | 104079330 A | 10/2014 |

OTHER PUBLICATIONS

Anshul Bharthan, "Aruba Instant—Rogue AP Troubleshooting", Technical Climb Webinar, Feb. 28, 2016, pp. 1-45.
(Continued)

*Primary Examiner* — Salvador E Rivas
(74) *Attorney, Agent, or Firm* — Brooks, Cameron & Huebsch, PLLC

(57) ABSTRACT

Example implementations relate to partitioning a radio into chains to scan channels. In some examples, a network device may comprise a processing resource and a memory resource storing machine-readable instructions to partition a default radio of the network device into a service chain and a scan chain in response to a scan request, scan a particular channel with the scan chain to discover devices operating on the particular channel of a network, and combine the service chain and the scan chain into the default radio.

20 Claims, 5 Drawing Sheets

(51) Int. Cl.
*H04B 7/0452* (2017.01)
*H03J 7/00* (2006.01)
*H04W 4/50* (2018.01)
*H03L 7/12* (2006.01)
*H04W 88/08* (2009.01)

(52) U.S. Cl.
CPC ............ *H04B 7/0452* (2013.01); *H04W 4/50* (2018.02); *H04W 88/08* (2013.01)

(58) Field of Classification Search
CPC . H03J 1/0091; H03J 7/00; H03L 7/12; H04W 4/50
See application file for complete search history.

(56) References Cited

U.S. PATENT DOCUMENTS

| | | | |
|---|---|---|---|
| 8,694,624 B2 | 4/2014 | Sinha et al. | |
| 8,817,813 B2 | 8/2014 | Iyer et al. | |
| 9,258,713 B2 | 2/2016 | Rangarajan et al. | |
| 9,549,332 B2 | 1/2017 | Ponnuswamy | |
| 2006/0251025 A1* | 11/2006 | Kwon | H04B 7/0686 370/334 |
| 2014/0148155 A1 | 5/2014 | Batta et al. | |
| 2017/0265205 A1* | 9/2017 | HomChaudhuri | H04W 16/14 |
| 2017/0373990 A1* | 12/2017 | Jeuk | H04L 45/306 |
| 2018/0270130 A1* | 9/2018 | Wang | G06F 9/445 |

OTHER PUBLICATIONS

Cisco, "Chapter-9 Configuring Radio Resource Management", Cisco Wireless LAN Controller Configuration Guide, 2017, pp. 9-28.
Ruckus Wireless, Inc., "Deploying High Density Wi-Fi", Design And Configuration Guide For Enterprise, 2015, 47 pages.
Search Report and Written Opinion received for PCT Application No. PCT/CN2017/087698, dated Feb. 26, 2018, 6 pages.

* cited by examiner

PARTITION A RADIO INTO A SERVICE CHAIN AND A SCAN CHAIN TO SCAN CHANNELS

BACKGROUND

A network device can transmit and/or receive electromagnetic waves to communicate with other devices. Electromagnetic waves can be transmitted and/or received by a radio chain of the network device.

The network device may communicate with the other devices on a radio channel. For example, the network device and the other devices may communicate using the same radio channel.

DETAILED DESCRIPTION

Figure 1:
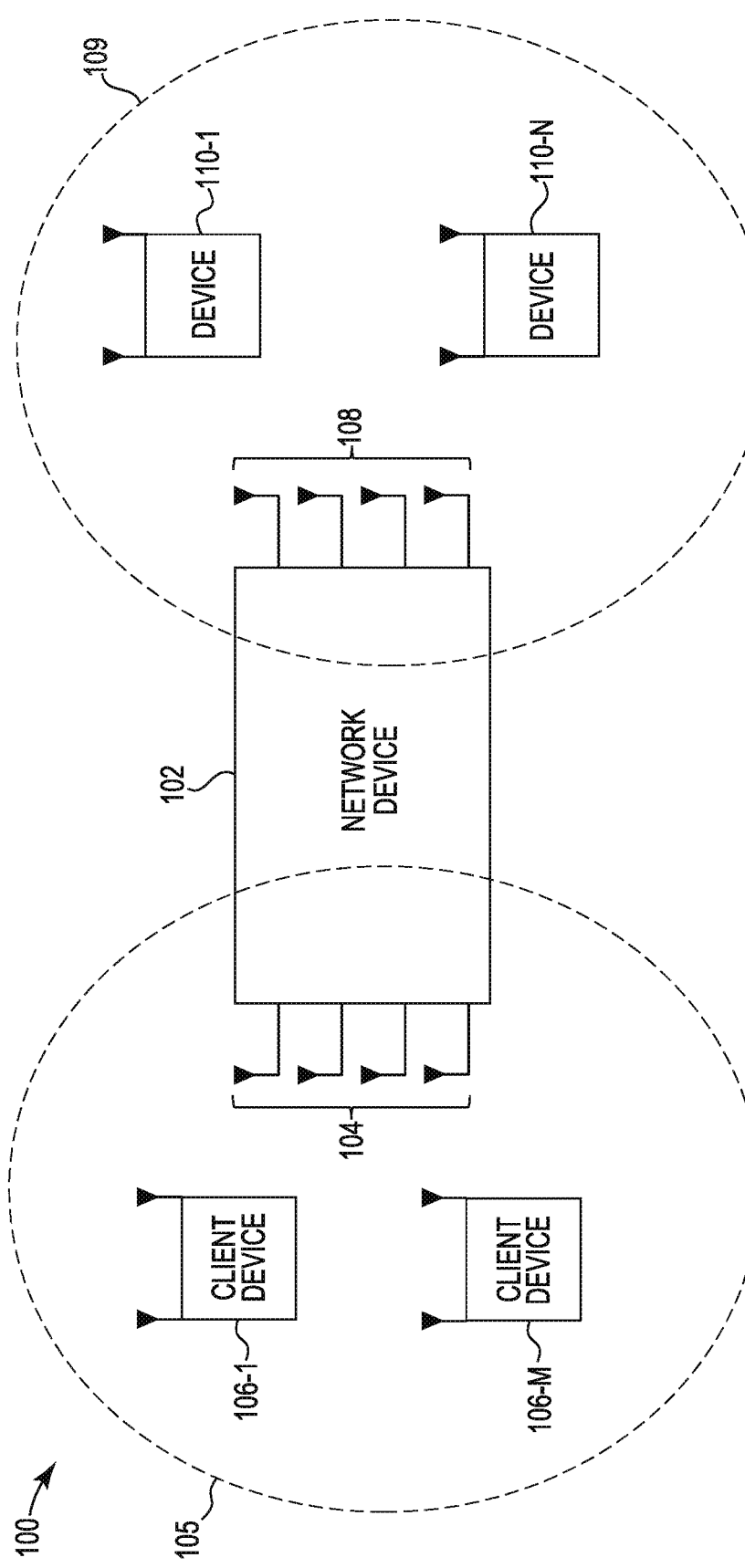
FIG. 1 illustrates an example of a network layout consistent with the disclosure.

A network device may use a radio chain to transmit and/or receive information. The information can be transmitted and/or received via a network. As used herein, the term "radio chain" can, for example, refer to hardware that can transmit and/or receive information via radio signals. Client devices and/or other devices may communicate with the network device on a radio channel using multiple radio chains. As used herein, the term radio channel can, for example, refer to a frequency or frequency range utilized by a network device to communicate (e.g., transmit and/or receive) information.

The network device may scan other channels to discover devices that may be operating on the other channels. In some situations, devices operating on the other channels may not be able to communicate with the network device. In some implementations, the network device can partition a default radio into a service chain and a scan chain. The scan chain can scan the other channels to discover other devices that may be operating on the other channels. As used herein, the term "service chain" can, for example, refer to a radio chain to provide network connectivity to client devices connected to the network device. As used herein, the term "scan chain" can, for example, refer to a radio chain to scan the other channels to discover other devices that may be operating on the other channels.

The service chain can provide network connectivity to client devices connected to the network device while the scan chain scans the other channels. As used herein, the term "network connectivity" can, for example, refer to an ability to transmit and/or receive information via radio signals via a network relationship. As used herein, the term "network relationship" can, for example, refer to a local area network (LAN), a wireless local area network (WLAN), a virtual local area network (VLAN), wide area network (WAN), personal area network (PAN), a distributed computing environment (e.g., a cloud computing environment), storage area network (SAN), Metropolitan area network (MAN), a cellular communications network, and/or the Internet, among other types of network relationships.

As used herein, the term "information" can, for example, refer to data, addresses, control, management (e.g., statistics) or any combination thereof. For data transmission, information may be transmitted as a message, namely a collection of bits in a predetermined format. A message such as wireless message may include a header and payload data having a predetermined number of bits of information. The wireless message may be placed in a format as a plurality of packets, frames, or cells.

In some implementations, partitioning a radio into chains to scan channels can promote continuous network connectivity to client devices connected to the network device while scanning other channels of the network. Using this partitioning mechanism, partitioning a radio into chains to scan channels can reduce chances of a frame loss to client devices during a scan, which may reduce a chance of a client device connectivity issue with the network device during the scan. As used herein, the term "mechanism" can, for example, refer to a component of a system or device to serve a plurality of functions, including but not limited to, software components, electronic components, electrical components, mechanical components, electro-mechanical components, etc.

FIG. 1 illustrates an example of a network layout 100 consistent with the disclosure. As illustrated in FIG. 1, the network layout 100 may include network device 102, service chain 104, service channel 105, client devices 106-1, 106-M (referred to collectively as client devices 106), scan chain 108, particular channel 109, and devices 110-1, 110-N (referred to collectively as devices 110).

As used herein, the term "default radio" can, for example, refer to a radio of a network device such as network device 102 that can provide network connectivity to client devices such as client devices 106 when network device 102 is not performing a scan. For example, although not shown in FIG. 1 for clarity and so as not to obscure examples of the disclosure, network device 102 can provide network connectivity to client devices 106 via the default radio when network device 102 is not performing a scan of a channel. The default radio can be a single radio, such as a WLAN radio, that can be partitioned into the service chain 104 and the scan chain 108. Service chain 104 and scan chain 108 can be combined into the default radio when network device 102 is not performing a scan of a particular channel 109, as is further described herein. As used herein, the term "network device" can, for example, refer to a device that is adapted to transmit and/or receive signaling and to process information within such signaling such as a station (e.g., any data processing equipment such as a computer, cellular phone, personal digital assistant, tablet devices, etc.), an access point, data transfer devices (such as network switches, routers, controllers, etc.) or the like.

Network device 102 can partition a default radio of network device 102 into service chain 104 and scan chain 108. As used herein, the term "partition" can, for example, refer to a division into or a distribution in portions or shares. For example, network device 102 can partition the default radio into radio chain portions. The portions of the default radio can include service chain 104 and scan chain 108.

As shown in FIG. 1, network device 102 can be a network device with an 8×8 antenna. As used herein, the term "antenna" can, for example, refer to a device that converts electric power into electromagnetic waves (e.g., radio waves), and/or vice versa. For example, a network device 102 with an 8×8 antenna can include, for example, a radio that can include eight transmission antennas and eight receiver antennas. Network device 102 can partition the default radio into a 4×4 service chain 104 and a 4×4 scan chain 108. That is, the 4×4 service chain 104 can include four transmission antennas and four receiver antennas, and the 4×4 scan chain 108 can include four transmission antennas and four receiver antennas.

Although network device 102 is shown in FIG. 1 as being partitioned into a 4×4 service chain 104 and a 4×4 scan chain 108, examples of the disclosure are not so limited. For example, network device 102 can partition the default radio into a 7×7 service chain and a 1×1 scan chain, among other partition schemes. That is, the 7×7 service chain 104 can include seven transmission antennas and seven receiver antennas, and the 1×1 scan chain 108 can include one transmission antenna and one receiver antenna.

Although network device 102 is shown in FIG. 1 as being an 8×8 antenna network device, examples of the disclosure are not so limited. For example, network device 102 can be smaller than an 8×8 network device (e.g., a 6×6 network device), or larger than an 8×8 network device (e.g., a 12×12 network device).

Network device 102 can partition the default radio into service chain 104 and scan chain 108 in response to a scan request. As used herein, the term "scan request" can, for example, refer to a request to scan a particular channel 109. The scan request can include the particular channel 109 to be scanned. The particular channel 109 may be a channel not being used by network device 102 to provide network connectivity to client devices 106. Stated another way, network device 102 can provide network connectivity to client devices 106 on service channel 105, where service channel 105 is a channel that is different from particular channel 109.

In some examples, the scan request may be periodically received by network device 102. As used herein, the term "periodically" can, for example, refer to recurring at regular and/or irregular intervals of time. For example, network device 102 can receive a scan request every one second, every five seconds, and/or combinations thereof (e.g., every-one second, then every five seconds, then every one second, etc.), although examples of the disclosure are not limited to periodic scan requests received every one second, five second, etc. For instance, the periodic scan requests may be received more than every one second or less than every one second.

In some examples, the scan request may be received by network device 102 in response to a change in a topology of a network. The network may be a network to which network device 102 is connected. The topology of the network may change and, as a result, network device 102 may scan the particular channel 109 to determine changes in the topology of the network. For example, an access point (AP) may be added to the network. The added AP can change the topology of the network to which network device 102 is connected. Network device 102 can receive a scan request in response to the addition of the AP to the network. An AP can refer to a networking device that allows a client device to connect to a wired or wireless network. As used herein, the term "access point" (AP) can, for example, refer to receiving points for any known or convenient wireless access technology which may later become known. Specifically, the term AP is not intended to be limited to IEEE 802.11-based APs. APs generally function as an electronic device that is adapted to allow wireless devices to connect to a wired network via various communications standards. An AP can include a processing resource, memory, and/or input/output interfaces, including wired network interfaces such as IEEE 802.3 Ethernet interfaces, as well as wireless network interfaces such as IEEE 802.11 Wi-Fi interfaces, although examples of the disclosure are not limited to such interfaces. An AP can include a memory resource, including read-write memory, and a hierarchy of persistent memory such as ROM, EPROM, and Flash memory.

Although described above as receiving a periodic scan request or receiving a scan request in response to a change in network topology, examples of the disclosure are not so limited. For example, network device 102 can receive a scan request in response to various performance issues with respect to the network. For instance, network device 102 can receive a scan request in response to sub-optimal channel and/or radio assignments, asymmetric AP links, beacon links being out of sync, and/or other performance issues, such as a performance threshold being exceeded, etc.

Network device 102 can scan particular channel 109 with scan chain 108 to discover devices 110 operating on particular channel 109 of a network. As used herein, the term "scan" can, for example, refer to searching for a device that may be unknown to network device 102. For example, devices 110 may be operating on particular channel 109, whereas client devices 106 may be operating on and network device 102 may be providing network connectivity on service channel 105. Network device 102 may not know about devices 110, as they are operating on particular channel 109. Network device 102 can scan particular channel 109 to discover devices 110.

Network device 102 can provide network connectivity to client devices 106 connected to network device 102 with service chain 104 while particular channel 109 is scanned by scan chain 108. For example, while scan chain 108 scans particular channel 109 to search for devices 110, service chain 104 can provide network connectivity to client devices 106 operating on service channel 105. Stated another way, network device 102 can provide network connectivity to client devices 106 connected to network device 102 on service channel 105, where service channel 105 is a different channel from particular channel 109 scanned by scan chain 108. By partitioning a default radio into service chain 104 and scan chain 108, a single radio may be utilized to provide network connectivity to existing client devices 106 while simultaneously scanning particular channel 109 for devices 110 operating on particular channel 109.

In some examples, network device 102 can scan particular channel 109 for a predetermined amount of time. For example, network device 102 can scan particular channel 109 for one second, although examples of the disclosure are not so limited. For example, network device 102 can scan particular channel 109 for more than one second or less than one second.

The predetermined amount of time can be modifiable. For example, network device 102 can scan particular channel 109 for modifiable amount of time. For instance, network device 102 can scan particular channel 109 for two seconds. The predetermined amount of time can be modified to be longer than two seconds or shorter than two seconds.

Network device 102 can combine service chain 104 and scan chain 108 into the default radio. For example, as shown in FIG. 1, service chain 104 and scan chain 108 are shown as being partitioned into a 4×4 service chain 104 and a 4×4 scan chain 108. Network device 102 can combine the 4×4 service chain 104 and the 4×4 scan chain 108 into the 8×8 default radio. The 8×8 default radio can provide network connectivity to client devices 106, and network device 102 no longer has any antennas scanning particular channel 109.

In some examples, network device 102 can combine service chain 104 and scan chain 108 into the default radio in response to scanning particular channel 109 for a predetermined amount of time. Stated another way, network device 102 can combine service chain 104 and scan chain 108 into the default radio after the predetermined amount of scan time. For example, scan chain 108 can scan particular channel 109 for two seconds, and network device 102 can combine service chain 104 and scan chain 108 into the default radio after two seconds.

In some examples, network device 102 can combine service chain 104 and scan chain 108 into the default radio in response to receiving a multiple-user multiple-input multiple-output (MU-MIMO) transmission from a client device 106 connected to network device 102. As used herein, a MU-MIMO device may utilize a radio channel to send and receive more than one data signal simultaneously. A MU-MIMO device may include operational constraints such that network device 102 can provide network connectivity to a MU-MIMO device in a non-partitioned state. That is, network device 102 may utilize the default radio, including up to all of the available radio chains included in the default radio to transmit and/or receive MU-MIMO frames to provide network connectivity to a MU-MIMO device, as is further described in connection with FIGS. 4 and 5.

In some examples, network device 102 can be an access point (AP), although examples of the disclosure are not limited to network device 102 being an AP.

Partition a radio into chains to scan channels according to the disclosure can allow a network device to scan for other devices without disturbing network connectivity of existing client devices connected to the network device. By partitioning a default radio into a service chain and a scan chain, the network device can provide continuous network connectivity to existing client devices using the dedicated service chain and simultaneously scan alternate channels using the scan chain. Partitioning a radio into chains to scan channels according to the disclosure can reduce chances of a frame loss to existing client devices while scanning while providing a stable network connection for existing client devices connected to the network device. Partitioning a radio into chains to scan channels can avoid having an antenna that is dedicated to scanning channels and is not able to provide network connectivity to client devices.

Figure 2:
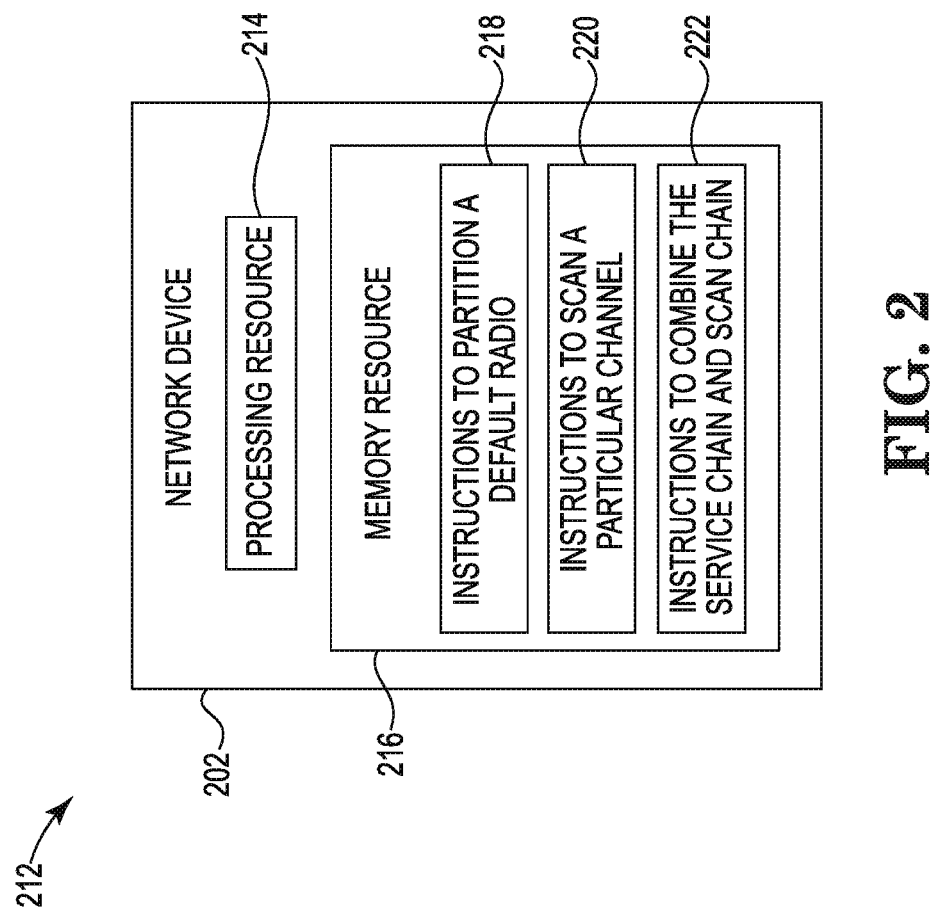
FIG. 2 is a block diagram of an example of a network device to partition a radio into chains to scan channels consistent with the disclosure.

FIG. 2 is a block diagram 212 of an example network device 202 to partition a radio into chains to scan channels consistent with the disclosure. As described herein, the network device 202 (e.g., network device 102, previously described in connection with FIG. 1) may perform a function related to partitioning a radio into chains to scan channels. Although not illustrated in FIG. 2, the network device 202 may include a machine-readable storage medium. Although the following descriptions refer to an individual processing resource and an individual machine-readable storage medium, the descriptions may also apply to a system with multiple processing resources and multiple machine-readable storage mediums. In such examples, the network device 202 may be distributed across multiple machine-readable storage mediums and the network device 202 may be distributed across multiple processing resources. Put another way, the instructions executed by the network device 202 may be stored across multiple machine-readable storage mediums and executed across multiple processing resources, such as in a distributed or virtual computing environment.

As illustrated in FIG. 2, the network device 202 may comprise a processing resource 214, and a memory resource 216 storing machine-readable instructions to cause the processing resource 214 to perform an operation relating to partitioning a radio into chains to scan channels. That is, using the processing resource 214 and the memory resource 216, the network device 202 may partition a default radio, among other operations. Processing resource 214 may be a central processing unit (CPU), microprocessor, and/or other hardware device suitable for retrieval and execution of instructions stored in memory resource 216.

The network device 202 may include instructions 218 stored in the memory resource 216 and executable by the processing resource 214 to partition a default radio. For example, network device 202 may include instructions 218 stored in the memory resource 216 and executable by the processing resource 214 to partition a default radio of network device 202 into a service chain and a scan chain in response to a scan request.

The network device 202 may include instructions 220 stored in the memory resource 216 and executable by the processing resource 214 to scan a particular channel. For example, network device 202 may include instructions 220 stored in the memory resource 216 and executable by the processing resource 214 to scan a particular channel with the scan chain to discover devices operating on the particular channel of a network.

The network device 202 may include instructions 222 stored in the memory resource 216 and executable by the processing resource 214 to combine the service chain and scan chain. For example, network device 202 may include instructions 222 stored in the memory resource 216 and executable by the processing resource 214 to combine the service chain and the scan chain into the default radio.

In this manner, the network device 202 may partition a default radio into a service chain and a scan chain, scan a particular channel with the scan chain while providing network connectivity to existing client devices with the service chain, and combine the service chain and the scan chain into the default radio.

Figure 3:
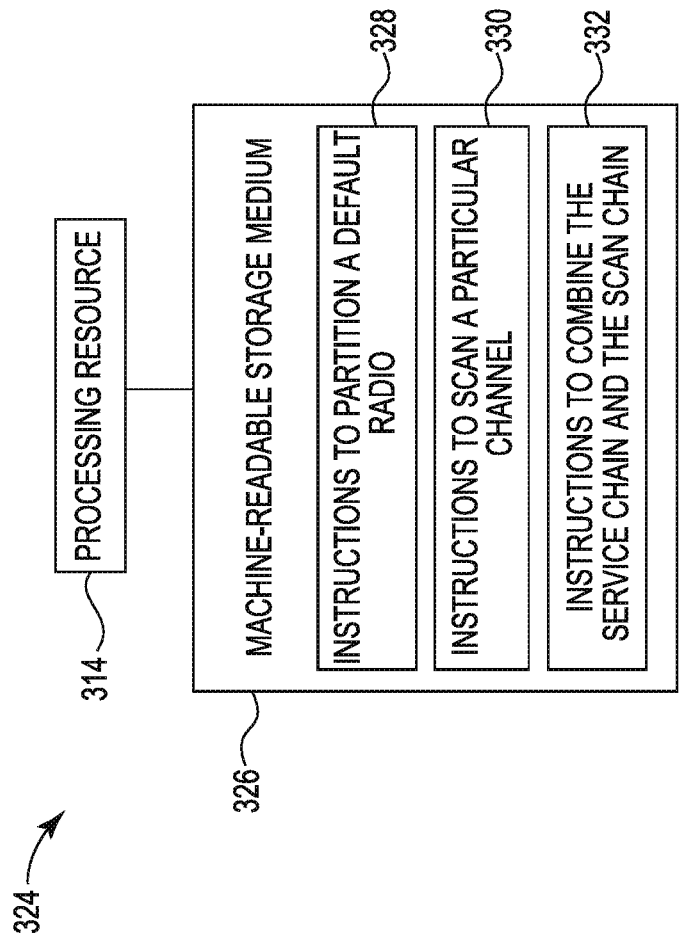
FIG. 3 is a block diagram of an example of a system consistent with the disclosure.

FIG. 3 is a block diagram of an example of a system 324 consistent with the disclosure. In the example of FIG. 3, system 324 includes a processing resource 314 (e.g., processing resource 214, previously described in connection with FIG. 2) and a machine-readable storage medium 326. Although the following descriptions refer to an individual processing resource and an individual machine-readable storage medium, the descriptions may also apply to a system with multiple processing resources and multiple machine-readable storage mediums. In such examples, the instructions may be distributed across multiple machine-readable storage mediums and the instructions may be distributed across multiple processing resources. Put another way, the instructions may be stored across multiple machine-readable storage mediums and executed across multiple processing resources, such as in a distributed computing environment.

Processing resource 314 may be a central processing unit (CPU), microprocessor, and/or other hardware device suitable for retrieval and execution of instructions stored in machine-readable storage medium 326. In the particular example shown in FIG. 3, processing resource 314 may receive, determine, and send instructions 328, 330, and 332. As an alternative or in addition to retrieving and executing instructions, processing resource 314 may include an electronic circuit comprising an electronic component for performing the operations of the instructions in machine-readable storage medium 326. With respect to the executable instruction representations or boxes described and shown herein, it should be understood that part or all of the executable instructions and/or electronic circuits included within one box may be included in a different box shown in the figures or in a different box not shown.

Machine-readable storage medium 326 may be any electronic, magnetic, optical, or other physical storage device that stores executable instructions. Thus, machine-readable storage medium 326 may be, for example, Random Access Memory (RAM), an Electrically-Erasable Programmable Read-Only Memory (EEPROM), a storage drive, an optical disc, and the like. The executable instructions may be "installed" on the system 324 illustrated in FIG. 3. Machine-readable storage medium 326 may be a portable, external or remote storage medium, for example, that allows the system 324 to download the instructions from the portable/external/remote storage medium. In this situation, the executable instructions may be part of an "installation package". As described herein, machine-readable storage medium 326 may be encoded with executable instructions related to antenna polarization patterns.

Instructions to partition a default radio 328, when executed by processing resource 314, may cause system 324 to partition, by a network device, a default radio of the network device into a service chain and a scan chain in response to receiving a scan request. In some examples, the scan request may be a periodic scan request. In some examples, the scan request may be received by the network device in response to a change in a topology of a network. The network may be a network to which the network device is connected.

Instructions to scan a particular channel 330, when executed by processing resource 314, may cause system 324 to scan, by the scan chain of the network device, a particular channel to discover devices operating on the particular channel of a network. The network device may be operating on a channel that is different from the particular channel. The service chain can provide network connectivity to existing client devices connected to the network device while the scan chain scans the particular channel.

Instructions to combine the service chain and the scan chain 332, when executed by processing resource 314, may cause system 324 to combine the service chain and the scan chain into the default radio. In some examples, the network device can combine the service chain and the scan chain into the default radio in response to scanning the particular channel for a predetermined amount of time. In some examples, the network device can combine the service chain and the scan chain into the default radio in response to receiving a MU-MIMO transmission from an existing client device connected to the network device, as is further described in connection with FIGS. 4 and 5.

Figure 4:
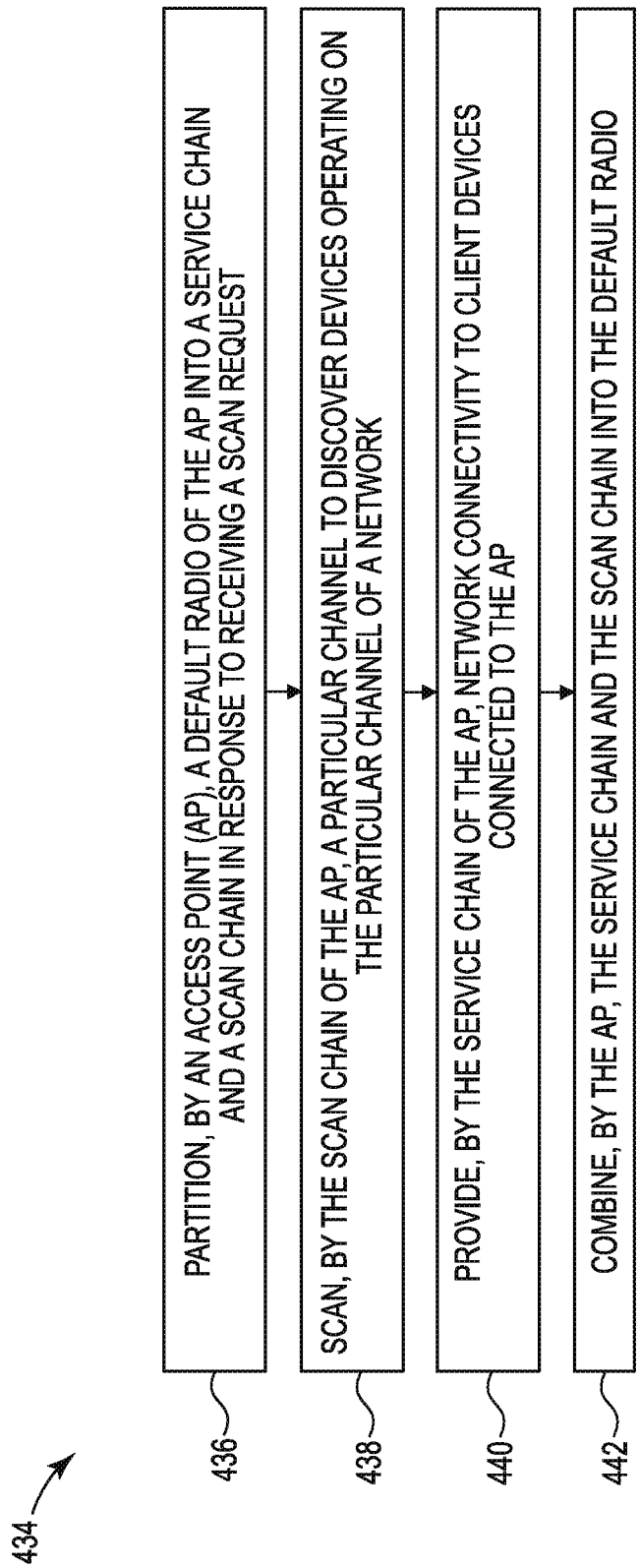
FIG. 4 illustrates an example of a method consistent with the disclosure.

FIG. 4 illustrates an example of a method 434 consistent with the disclosure. Method 434 may be performed by a network device (e.g., network device 102, 202, described in connection with FIGS. 1 and 2, respectively).

At 436, the method 434 may include partitioning, by an access point (AP), a default radio of the AP into a service chain and a scan chain in response to receiving a scan request. In some examples, the scan request may be a periodic scan request. In some examples, the scan request may be received by the network device in response to a change in a topology of a network. The network may be a network to which the network device is connected.

In some examples, the AP can determine, prior to partitioning the default radio, whether MU-MIMO transmissions by existing client devices are in progress. For example, the AP may operate using the default radio to successfully transmit and/or receive MU-MIMO transmissions with existing client devices connected to the network device. The AP can refrain from partitioning the default radio in response to MU-MIMO transmissions by the client devices being in progress, as is further described in connection with FIG. 5.

At 438, the method 434 may include scanning, by the scan chain of the AP, a particular channel to discover devices operating on the particular channel of a network. The AP can be operating on a channel that is different from the particular channel.

At 440, the method 434 may include providing, by the service chain of the AP, network connectivity to client devices connected to the AP. For example, the scan chain of the AP can simultaneously scan the particular channel of the network while the service chain of the AP provides network connectivity to existing client devices connected to the AP.

At 442, the method 434 may include combining, by the AP, the service chain and the scan chain into the default radio. In some examples, the AP may combine the service chain and the scan chain into the default radio in response to scanning the particular channel for a predetermined amount of time. In some examples, the AP may combine the service chain and the scan chain into the default radio in response to receiving a MU-MIMO transmission from a client device connected to the network device.

Method 434 may be repeated. In some examples, method 434 may be repeated in response to receiving a scan request. In some examples, method 434 may be repeated in response to a change in network topology.

Figure 5:
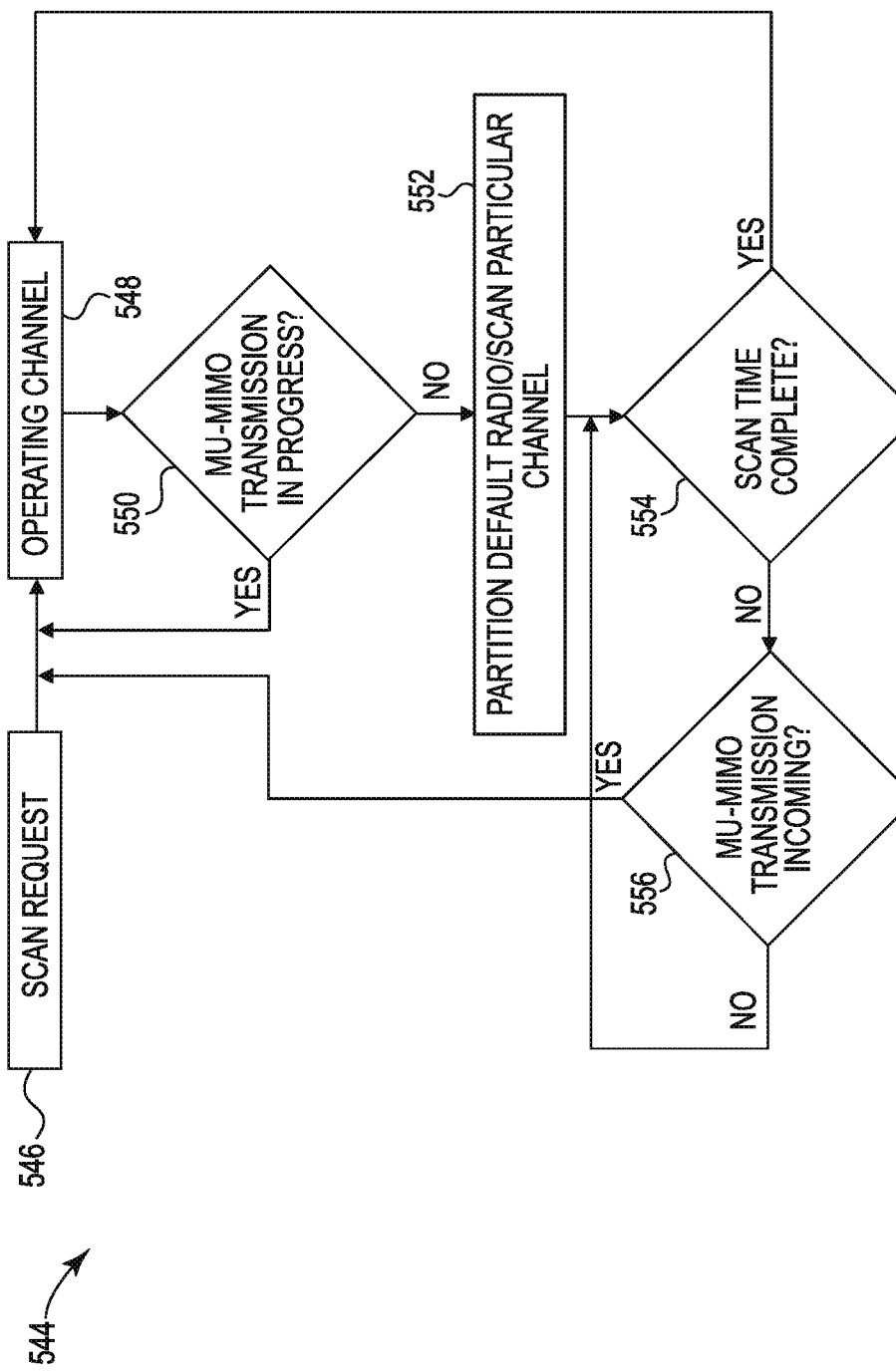
FIG. 5 illustrates an example flow chart to partition a radio into chains to scan channels consistent with the disclosure.

FIG. 5 illustrates an example flow chart 544 to partition a radio into chains to scan channels consistent with the disclosure. At 546, a scan request may be generated. The scan request may be periodic or in response to a change in network topology. At 548, a network device may be operating on an operating channel. That is, the network device may be providing network connectivity to existing client devices on the operating channel. The network device can receive the scan request.

At 550, the network device can determine whether any MU-MIMO transmissions by the client devices are in progress. In progress MU-MIMO transmissions can include receiving MU-MIMO transmissions from client devices and/or transmitting MU-MIMO transmissions by the network device to client devices. In response to MU-MIMO transmissions by the client devices being in progress, the network device can refrain from partitioning a default radio of the network device. For example, the network device can operate in a default mode such that the default radio is not partitioned when there are client devices performing MU-MIMO transmissions with the network device, as the network device may utilize up to all of the available radio chains included in the default radio to transmit and/or receive MU-MIMO frames in order to provide network connectivity to a MU-MIMO device.

In the example in which MU-MIMO transmissions are in progress, the network device can queue received scan requests. For example, client devices may be transmitting MU-MIMO transmissions with the network device while three scan requests are received. The three scan requests may include requests to scan three different channels (e.g., channel 1, channel 2, and channel 3), where the network device is operating on channel 4.

At 552, the network device can partition the default radio and scan the channels received from scan requests in response to MU-MIMO transmissions by the client devices ceasing. For example, the MU-MIMO transmissions with the network device from client devices may cease, and the network device can partition the default radio into a service chain and a scan chain. The service chain can provide network connectivity to client devices while the scan chain can scan queued channels (e.g., channel 1, channel 2, and channel 3).

Although described above as queueing three channels, examples of the disclosure are not so limited. For example, the network device can queue less than three channels to be scanned or more than three channels to be scanned.

At 554, the network device can determine whether the scan time is complete. For example, in response to the scan time being complete, the network device can combine the scan chain and the service chain into the default radio. The default radio can resume providing network connectivity to existing client devices via the operating channel at 548. The network device can resume MU-MIMO transmissions.

At 556, the network device can determine whether any MU-MIMO transmissions are incoming in response to the scan time not being complete. For example, the network device can determine whether the client devices may have transmitted any MU-MIMO transmissions to the network device.

In response to no MU-MIMO transmissions incoming, the network device can continue scanning channels included in the scan request. For example, the network device can continue scanning any queued channels received in scan requests.

In response to an incoming MU-MIMO transmission, the network device can combine the scan chain and the service chain into the default radio. The default radio can resume providing network connectivity to existing client devices via the operating channel at 548, and the network device can resume MU-MIMO transmissions.

Although described above as operating in a default mode such that the default radio is not partitioned when there are client devices performing MU-MIMO transmissions with the network device, examples of the disclosure are not so limited. For example, the network device can operate in a default mode such that the default radio is partitioned into the service chain and the scan chain. The default mode with a partitioned default radio may be used when no client devices connected to the network device are MU-MIMO capable. The network device can combine the service chain and the scan chain into the default radio in response to a client device that is MU-MIMO capable connecting with the network device, and can operate in a default mode such that the default radio is not partitioned.

Partitioning a radio into chains to scan channels, according to the disclosure, can allow a network device to provide continuous network connectivity to existing client devices while scanning for other devices on different channels. By partitioning a default radio into a service chain and a scan chain, the network device can perform dynamic resource allocation. That is, the network device may avoid a dedicated/permanent scan chain, allowing for better resource allocation when not performing scanning operations. Examples of the disclosure can reduce chances of a frame loss to existing client devices, which can reduce chances of a loss of network connectivity to the existing client devices, while the network device scans different channels.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure.

The figures herein follow a numbering convention in which the first digit corresponds to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. Elements shown in the various figures herein can be added, exchanged, and/or eliminated so as to provide a plurality of additional examples of the disclosure. In addition, the proportion and the relative scale of the elements provided in the figures are intended to illustrate the examples of the disclosure, and should not be taken in a limiting sense. As used herein, the designators "M" and "N", particularly with respect to reference numerals in the drawings, indicates that a plurality of the particular feature so designated can be included with examples of the disclosure. The designators can represent the same or different numbers of the particular features. Further, as used herein, "a plurality of" an element and/or feature can refer to more than one of such elements and/or features.

What is claimed:

1. A network device, comprising:
   a processing resource; and
   a memory resource storing machine-readable instructions to cause the processing resource to:
   partition a default radio of the network device into a service chain and a scan chain in response to a scan request, wherein the service chain provides network connectivity to client devices connected to the network device, and wherein the scan chain scans other channels to discover devices operating on the other channels;
   scan a particular channel with the scan chain for a predetermined amount of time to discover devices operating on the particular channel of a network; and
   combine, after completing the scan and after the predetermined amount of time, the service chain and the scan chain into the default radio.

2. The network device of claim 1, including instructions to cause the processing resource to provide network connectivity to client devices connected to the network device with the service chain while the particular channel is scanned by the scan chain.

3. The network device of claim 1, wherein the channel scanned by the scan chain is determined based on the scan request.

4. The network device of claim 1, wherein the network device provides network connectivity to client devices connected to the network device on a channel that is different from the particular channel scanned by the scan chain.

5. The network device of claim 1, including instructions to cause the processing resource to:
   combine the service chain and the scan chain into the default radio in response to receiving a multiple-user multiple-input multiple-output (MU-MIMO) transmission from an existing client device connected to the network device.

6. The network device of claim 1, wherein the network device is an access point (AP).

7. The network device of claim 1, including instructions to cause the processing resource to:

partition antennas of the network device into the service chain and the scan chain in response to the scan request.

8. The network device of claim 1, including instructions to cause the processing resource to:
queue the scan request in response to MU-MIMO transmissions being in progress; and
scan the particular channel in response to MU-MIMO transmissions ceasing.

9. A non-transitory machine-readable storage medium having stored thereon machine-readable instructions to cause a computer processor to:
partition, by a network device, a default radio of the network device into a service chain and a scan chain in response to receiving a scan request, wherein the service chain provides network connectivity to client devices connected to the network device, and wherein the scan chain scans other channels to discover devices operating on the other channels;
scan, by the scan chain of the network device, a particular channel for a predetermined amount of time to discover devices operating on the particular channel of a network, wherein the network device is operating on a channel that is different from the particular channel; and
combine, after completing the scan and after the predetermined amount of time, the service chain and the scan chain into the default radio.

10. The medium of claim 9, comprising instructions to combine the service chain and the scan chain into the default radio in response to at least one of:
receiving a multiple-user multiple-input multiple-output (MU-MIMO) transmission from a plurality of client devices connected to the network device; and
transmitting a MU-MIMO transmission to the plurality of client devices connected to the network device.

11. The medium of claim 10, wherein the predetermined amount of time is modifiable.

12. The medium of claim 9, wherein the scan request is periodically received by the network device.

13. The medium of claim 9, wherein the scan request is received by the network device in response to a change in a topology of the network.

14. The medium of claim 9, wherein the method includes:
queueing the scan request in response to MU-MIMO transmissions being in progress; and
scanning the particular channel in response to MU-MIMO transmissions ceasing.

15. A method, comprising:
partitioning, by an access point (AP), a default radio of the AP into a service chain and a scan chain in response to receiving a scan request, wherein the service chain provides network connectivity to client devices connected to the network device, and wherein the scan chain scans other channels to discover devices operating on the other channels;
scanning, by the scan chain of the AP, a particular channel for a predetermined amount of time to discover devices operating on the particular channel of a network, wherein the AP is operating on a channel that is different from the particular channel;
providing, by the service chain of the AP, network connectivity to client devices connected to the AP; and
combining, by the AP after completing scanning and after the predetermined amount of time, the service chain and the scan chain into the default radio.

16. The method of claim 15, wherein the method includes combining the service chain and the scan chain in response to
receiving a multiple-user multiple-input multiple-output (MU-MIMO) transmission from a client device connected to the network device.

17. The method of claim 15, wherein the method includes:
determining, by the AP, whether MU-MIMO transmissions by the client devices are in progress; and
refraining from partitioning the default radio in response to MU-MIMO transmissions by the client devices being in progress.

18. The method of claim 17, wherein the method includes:
queueing received scan requests in response to the MU-MIMO transmissions being in progress; and
scanning, by the scan chain of the AP, particular channels included in the queued scan requests in response to MU-MIMO transmissions by the client devices ceasing.

19. The method of claim 15, wherein the method includes:
partitioning antennas of the network device into the service chain and the scan chain in response to the scan request.

20. The method of claim 15, wherein the scan request is received in response to at least one of: an asymmetric AP link, an out of sync beacon link, or a performance threshold being exceeded.

* * * * *